United States Patent
Walker

(10) Patent No.: US 7,365,551 B2
(45) Date of Patent: Apr. 29, 2008

(54) EXCESS OVERDRIVE DETECTOR FOR PROBE CARDS

(75) Inventor: Steven J. Walker, Monrovia, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 160 days.

(21) Appl. No.: 11/535,219

(22) Filed: Sep. 26, 2006

(65) Prior Publication Data

US 2007/0205782 A1    Sep. 6, 2007

Related U.S. Application Data

(63) Continuation-in-part of application No. 11/369,343, filed on Mar. 6, 2006.

(51) Int. Cl.
*G01R 31/02* (2006.01)

(52) U.S. Cl. .................................................. 324/754

(58) Field of Classification Search ...................... None
See application file for complete search history.

(56) References Cited

U.S. PATENT DOCUMENTS

| | | | | |
|---|---|---|---|---|
| 3,613,001 A | * | 10/1971 | Hostetter | 324/762 |
| 4,918,374 A | * | 4/1990 | Stewart et al. | 324/758 |
| 5,657,394 A | * | 8/1997 | Schwartz et al. | 382/151 |
| 6,100,708 A | * | 8/2000 | Mizuta | 324/762 |
| 6,118,894 A | * | 9/2000 | Schwartz et al. | 324/758 |
| 6,174,744 B1 | * | 1/2001 | Watanabe et al. | 324/754 |
| 6,414,501 B2 | * | 7/2002 | Kim et al. | 324/754 |
| 6,710,798 B1 | * | 3/2004 | Hershel et al. | 324/758 |
| 6,933,738 B2 | * | 8/2005 | Martin et al. | 324/758 |
| 7,230,440 B2 | * | 6/2007 | Hantschel et al. | 324/762 |
| 7,259,577 B2 | * | 8/2007 | Root et al. | 324/754 |
| 7,282,932 B2 | * | 10/2007 | Kirby et al. | 324/754 |
| 7,288,954 B2 | * | 10/2007 | Kirby et al. | 324/765 |
| 2002/0008530 A1 | * | 1/2002 | Kim et al. | 324/754 |
| 2005/0164486 A1 | * | 7/2005 | Lua et al. | 438/617 |

OTHER PUBLICATIONS

PCT International Search Report and Written Opinion of the International Searching Authority.

* cited by examiner

*Primary Examiner*—Jermele M Hollington
(74) *Attorney, Agent, or Firm*—Manuel F. de la Cerra

(57) ABSTRACT

A novel structure for a probe card that comprises a deformable metal or other deformable material for detecting excess overdrive and a method for using the same are disclosed. This detection structure may be positioned on the substrate along the bending path of the probe, such that should the probe experience excess overdrive, then the detection structure will permanently deform where it is hit by any portion of the probe. Alternatively, the detection structure may be embedded in the substrate, and may also function as a fiducial for alignment detection. Inspection of the probe card, and specifically the detection structure, will reveal whether any probe has experienced excess overdrive. Should the inspection reveal that certain regions of the card experienced excess overdrive, this may indicate a planarity problem that affects production line yield.

6 Claims, 8 Drawing Sheets

EXCESS OVERDRIVE DETECTOR FOR PROBE CARDS

1. CLAIM OF PRIORITY

The present patent application is related as a Continuation-in-Part to U.S. patent application Ser. No. 11/369,343 entitled *Optically Enhanced Probe Alignment*, filed on Mar. 6, 2006 by inventor Steven J. Walker assigning to the same Touchdown Technologies, Inc. of Baldwin Park, Calif. that is the assignee of the present invention. The content of the related predecessor patent application is incorporated herein by reference.

2. FIELD OF THE INVENTION

The present invention relates to devices for testing semiconductor wafers and more particularly to a novel probe card structure for semiconductor wafer testing.

3. BACKGROUND OF THE INVENTION

Integrated circuits are made in a bulk parallel process by patterning and processing semiconductor wafers. Each wafer contains many identical copies of the same integrated circuit referred to as a "die." Semiconductor wafers must be tested before the die is cut into individual integrated circuits and packaged for sale. If defects are detected the defective die can be culled before wasting resources packaging a defective part.

To test a wafer, a probe card is commonly used which comes into contact with the surface of the wafer. The probe card generally contains three unique characteristics: (1) an XY array of individual probes that bend in the Z direction to allow contact with the die; (2) an electrical interface to connect the card to a circuit test apparatus; and (3) a rigid reference plane defined in such a way that the probe card can be accurately mounted in the same location on the wafer tester. FIG. 7 illustrates an array of probes (705) on a substrate (710). Probe tips (715) for each probe in the array (705) are allowed to bend in the Z direction (perpendicular to the substrate (710)). When the probe card is brought in contact with the die, the Z-direction bending allows for a solid contact with the probe tip (715). The probe card ultimately provides an electrical interface that allows a circuit test apparatus to be temporarily connected to the individual die. This method of die testing is extremely efficient because many die can be tested at the same time. To drive this efficiency even higher, probe card manufactures are making larger probe cards with an ever-increasing numbers of probes.

FIG. 8 depicts a cross sectional view of a probe card showing the substrate (805), probe base (810), bending element (815), tip supporting structure (820), and probe tip (825). The entire probe card is generally moved in the Z-direction (depicted by arrow 830) causing the bending element (815) to bend allowing the probe tip (825) to come into contact with the die that is under test. FIGS. 9A to 9C illustrate how the probe bends while being brought into contact with the die. FIG. 9A depicts a cross sectional view a probe card with showing the substrate (905), probe base (910), bending element (915), tip supporting structure (920), and probe tip (925). FIG. 9A is the starting position of the probe—i.e, no bending of the bending element (915). Between the probe bending element (915) and the substrate (905) is a clearance (930), often called the overdrive. Die manufacturers often specify the overdrive for the probe cards that test the die. Referring to FIG. 9B, the probe tip (925) is moved in the direction of arrow 935 in contact with the die (not shown) causing the bending element to bend (shown as 940) and also causing the clearance to decrease (shown as 945). At this position, the probe card should stop and allow the testing of the die to begin. However, if the probe card is inadvertently brought too close to the die, the bending element will bend even further until it hits the substrate (shown as 950 in FIG. 9C), an event herein referred to as excess overdrive. This may damage the probe and, possibly the die it is testing. The damaged probe card and/or die may yield false positives, reducing the testing line yield.

What is needed, therefore, is a method and apparatus that allows for quick and inexpensive inspection to identify probes that have experienced excess overdrive on a probe card.

4. SUMMARY OF THE INVENTION

The present invention provides a probe card with an excess overdrive detecting structure. This detection structure may be constructed of a deformable metal or other deformable material. It may be positioned on the substrate along the bending path of the probe. As such, should the probe experience excess overdrive then the detection structure will be permanently deformed where it is hit by any portion of the probe. In one embodiment, the detection structure is positioned on the probe such that excess overdrive will cause it to hit the substrate and permanently deform. In another embodiment, the detection structure may be embedded in the substrate. In yet another embodiment, the detection structure may also function as a fiducial for alignment detection.

Inspection of the probe card, and specifically the detection structure, will reveal whether any probe has experienced excess overdrive. Should the inspection reveal that certain regions of the card experienced excess overdrive, this may indicate a planarity problem that can affect production yield.

5. BRIEF DESCRIPTION OF THE DRAWINGS

6. DETAILED DESCRIPTION OF THE PREFERRED EMBODIMENT

What is described below is a novel structure for a probe card that comprises a deformable metal or other deformable material for detecting excess overdrive and a method for using the same. This detection structure may be positioned on the substrate along the bending path of the probe structure, such that should the probe experience excess overdrive, then the detection structure will permanently deform where it is hit by any portion of the probe structure. What is meant by permanent deformation is deformation that will persist under normal operating conditions of the probe card such that the deformation can be detected when the probe card is inspected.

Figure 1A:
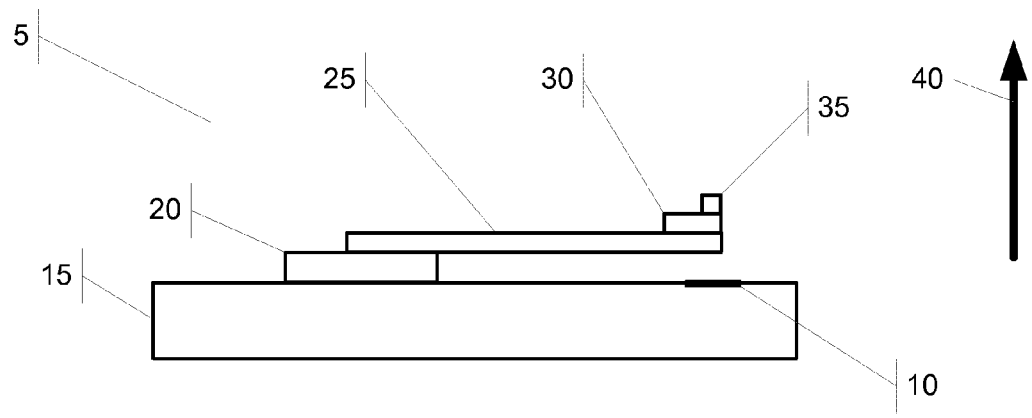
FIGS. 1A-1C are cross-sectional views of the novel probe card with an excess overdrive detecting structure.
Figure 1B:
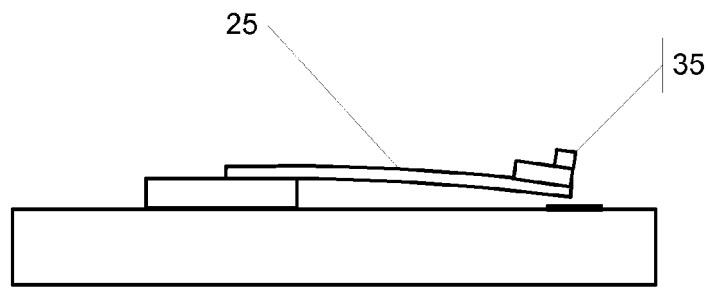
Figure 1C:

FIG. 1A is a cross sectional area of a probe card (5) with an excess overdrive detecting structure (10), that has been photolithographically applied to the substrate (15). The probe structure comprises the probe base (20), bending element (25), tip supporting structure (30), and probe tip (35). During testing, the semiconductor wafer with the die under test is moved in the Z-direction (depicted by arrow 40) towards the probe card. In FIG. 1B, the probe tip (35) is in contact with the die under test, causing the bending element (25) to bend. This is the optimal position for testing because it allows for a constant pressure between the probe tip (35) and the die which results in a more reliable ohmic electrical connection. Also, this position will not cause damage to the probe card (5) or the die. If, the probe card (5) is brought too close to the die (i.e., too far in the direction of arrow 40), then the bending element (25) will bend to far and hit the excess overdrive detecting structure (10) at spot 45. Because this detection structure (10) is made from a permanently deformable material (for example gold) it allows the probe bending element to dig into it. Once the probe completes testing and pulls away from the die, the excess overdrive detecting structure (10) will be permanently deformed, indicating that this particular probe experienced an excess overdrive.

Figure 2A:
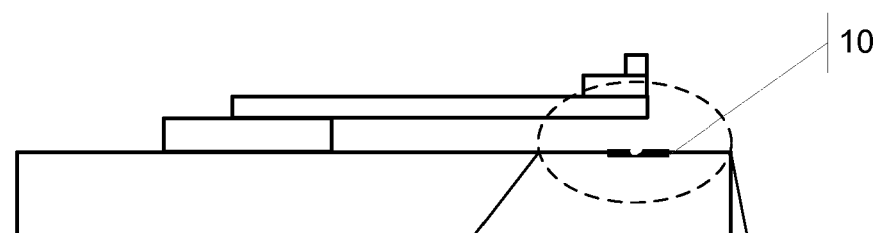
FIGS. 2A and 2B are cross-sectional views of the novel probe card with an excess overdrive detecting structure, where the probe card experienced excess overdrive.
Figure 2B:
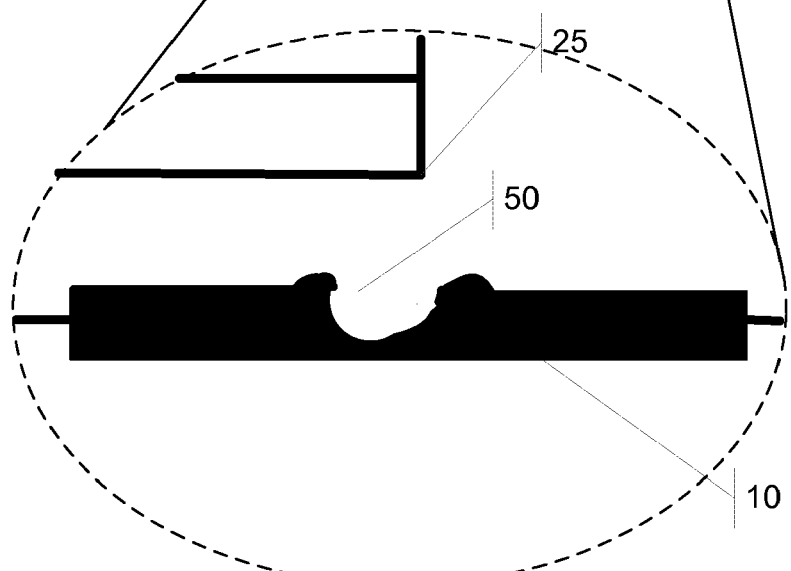

FIG. 2A depicts a cross section area of a probe card that has experienced excess overdrive. The excess overdrive detecting structure (10) has a noticeable divot. FIG. 2B is a magnified view of the detection structure (10), which shows the divot (50) that was created when the bending element (25) dug into the detection structure (10). Upon inspection of the probe card, the divot (50) will be noticeable, indicating that the card experienced excess overdrive such that it may be damaged or may be damaging the die under test.

Figure 3A:
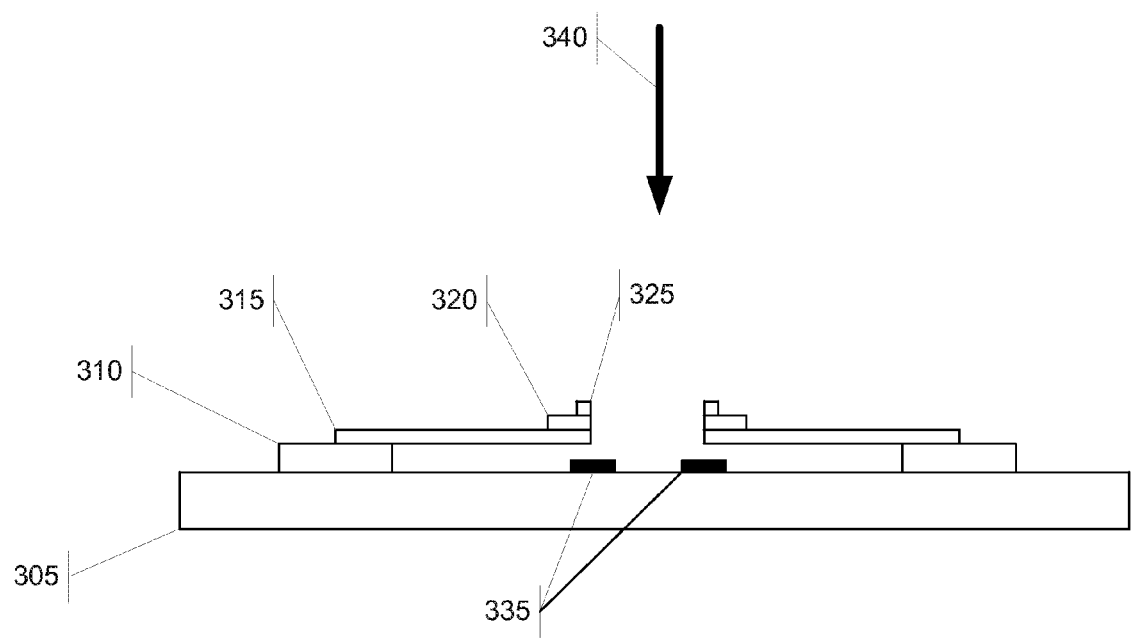
FIG. 3A is a cross-sectional view of the novel probe card with an excess overdrive detecting structure, where the structure also functions as a fiducial for alignment detection.
Figure 3B:
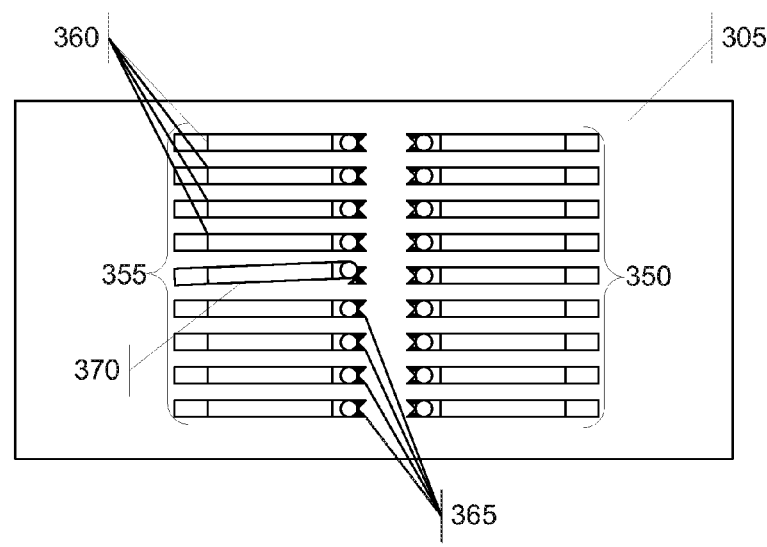
FIG. 3B is a plan view of a novel probe card, wherein a probe is misaligned relative to excess overdrive structure on the substrate.

In FIG. 3A, the excess overdrive detection structure also serves as a fiducial for determining proper probe alignment. As described in more detail in the related patent application Ser. No. 11/369,343 filed on Mar. 6, 2006, entitled Optically Enhanced Probe Alignment, a set of fiducials may be used to assist in determining the alignment of a probe on a probe card. In one embodiment, the probe card comprises a substrate (305), probe base (310), bending element (315), tip supporting structure (320), probe tip (325), and an excess overdrive detection structure (335). The detection structure (335) may be fiducial pattern applied to the substrate (305) of the probe card in such a way that it can be seen when the probe card is examined under an optical microscope. The probe structure (i.e., elements 310, 315, 320 and 325) provides a first fiducial, while the detection structure (335) provides the second fiducial. Upon examination of the probes, any probe that is misaligned, with respect to the intended position, will also be misaligned with the detection structure (335) (which may also be a fiducial pattern) that is visible when looking in the Z-direction (as shown by the arrow 340). One such misalignment is shown in FIG. 3B. The probe card contains two arrays of probes (350 and 355) on a substrate (305), where each array comprises nine individual probes (360). The probe card also contains two arrays of excess overdrive detection structures, where each of these arrays comprises nine individual excess overdrive detection structures (365). One of the probes (370) is misaligned such that the asymmetry caused by the misalignment is readily visible under microscopic examination. Although the pattern from the overdrive detection structures (365) is symmetrical in this embodiment, it need not be. Several other embodiments are disclosed in the '343 application using a set of fiducials and are incorporated herein by reference. As described above, one of the set of fiducials may be the excess overdrive detection structure.

Figure 4A:
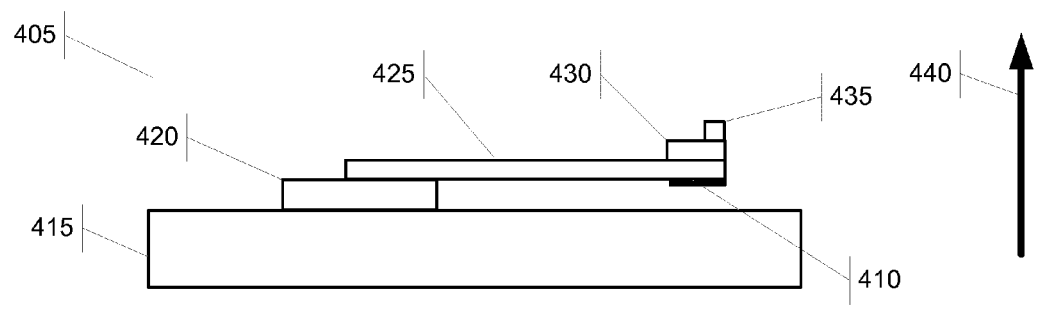
FIGS. 4A-4C are cross-sectional views of the novel probe card with an excess overdrive detecting structure.
Figure 4B:
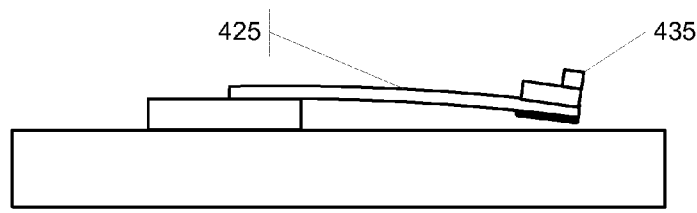
Figure 4C:
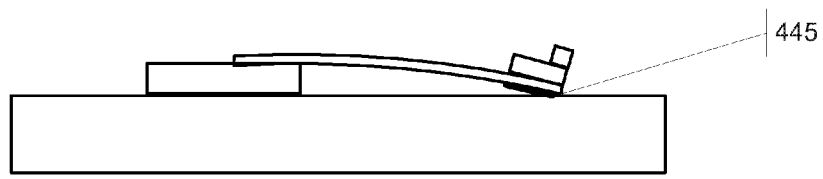
Figure 5A:
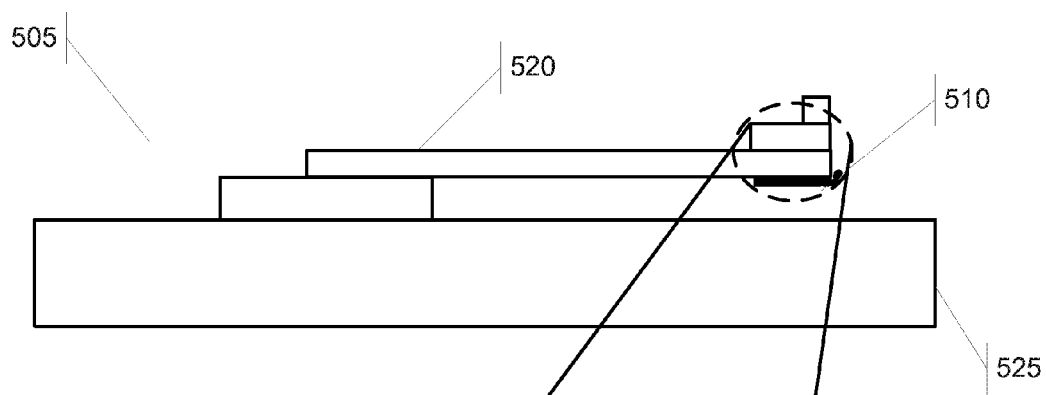
FIGS. 5A and 5B are cross-sectional views of the novel probe card with an excess overdrive detecting structure, where the probe card experienced excess overdrive.
Figure 5B:
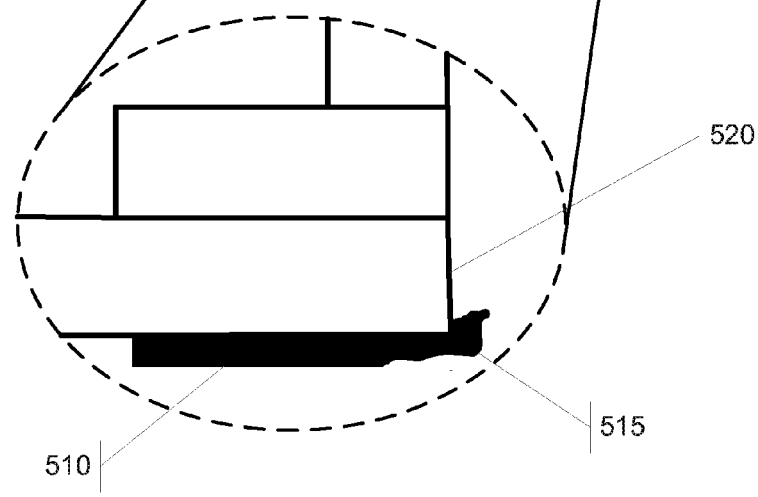

FIGS. 4A-4C illustrate another embodiment of the excess overdrive detecting structure. FIG. 4A is a cross sectional area of a probe card (405) with the excess overdrive detecting structure (410). The probe card comprises a substrate (415), probe base (420), bending element (425), tip supporting structure (430), probe tip (435) and the detecting structure (410). Unlike the previously disclosed detecting structure, here the detecting structure (410) has been photolithographically applied to the probe structure and not the substrate (415). While testing, the semiconductor with the die under test is moved in the Z-direction (depicted by arrow 440) towards the probe card. In FIG. 4B, the probe tip (435) has come into contact with the die under test, which causes the bending element (425) to bend. This is the optimal testing position because it allows for a constant pressure between the probe tip (435). Also, this position will not cause damage to the probe card (405) or the die from excess overdrive. Should the probe card (405) nonetheless be brought too close to the die, then the bending element (425) will bend to far, causing the excess overdrive detecting structure (410) to hit the substrate (415) at spot 445 and permanently deform. FIG. 5A depicts a cross sectional area of a probe card (505) that has experienced excess overdrive. The excess overdrive detecting structure (510) has been noticeably deformed. FIG. 5B is a magnified view of the detection structure (510) that shows the deformation (515) that was created when the detecting structure (510) hit the substrate (525). During inspection of the probe card, this deformation (515) will be seen, indicating that the card experienced excess overdrive.

Figure 6:
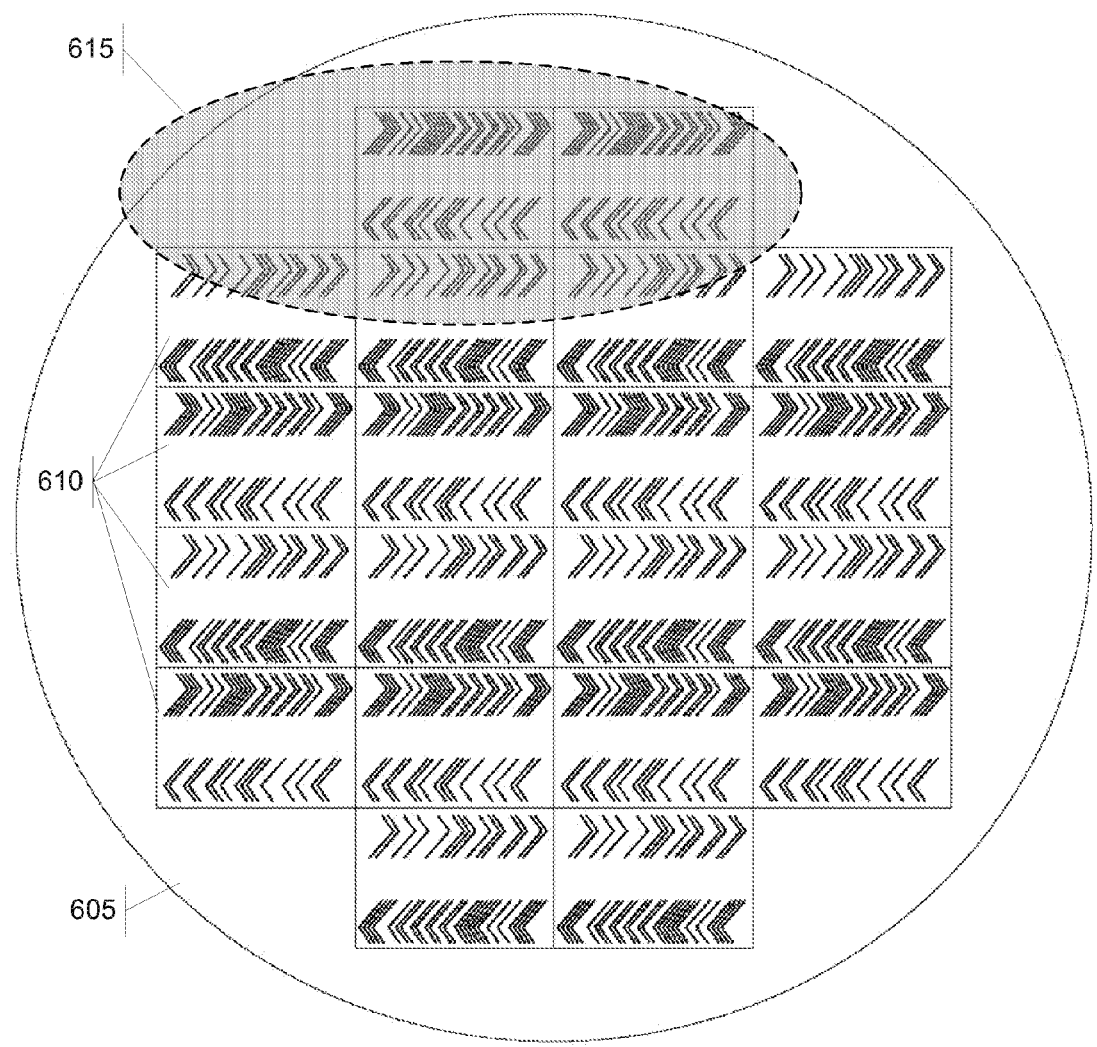
FIG. 6 is a plan view of a probe card with twenty single die probe areas and a shaded area where the probes experienced excess overdrive.
Figure 7:
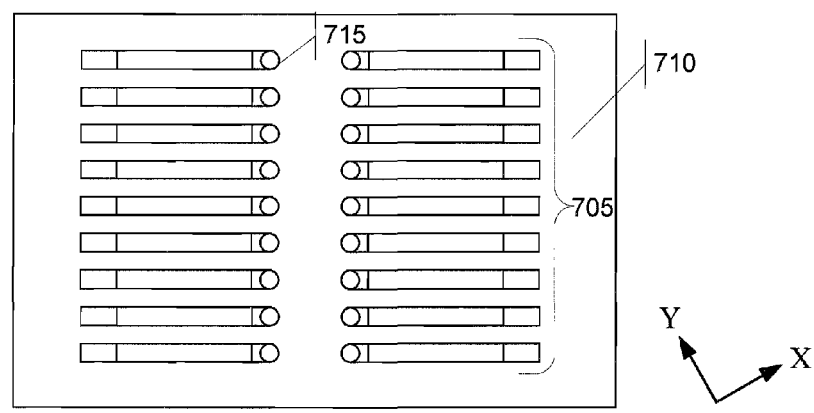
FIG. 7 is a plan view of a generic probe card.
Figure 8:
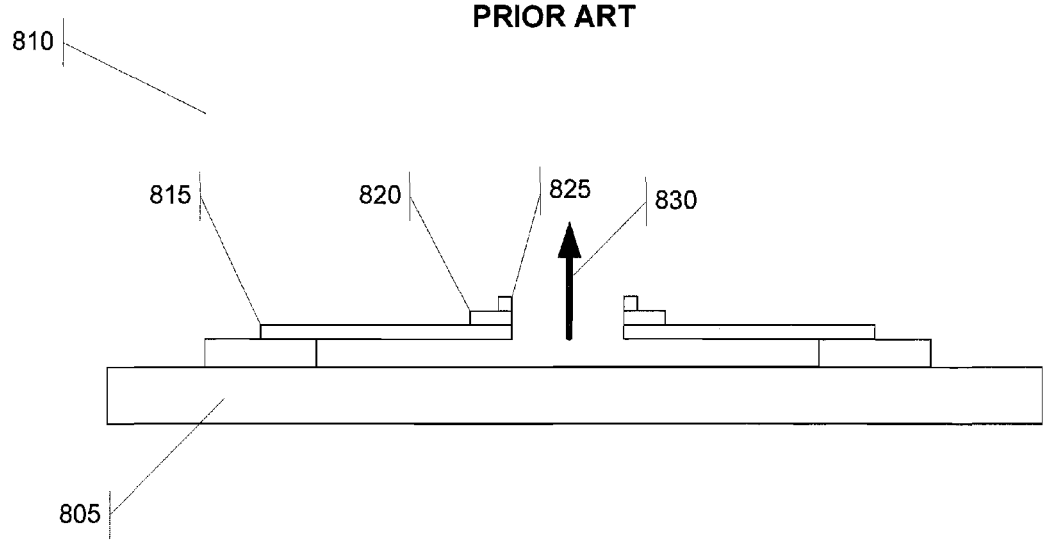
FIG. 8 is a cross-sectional view of generic probe card.
Figure 9A:
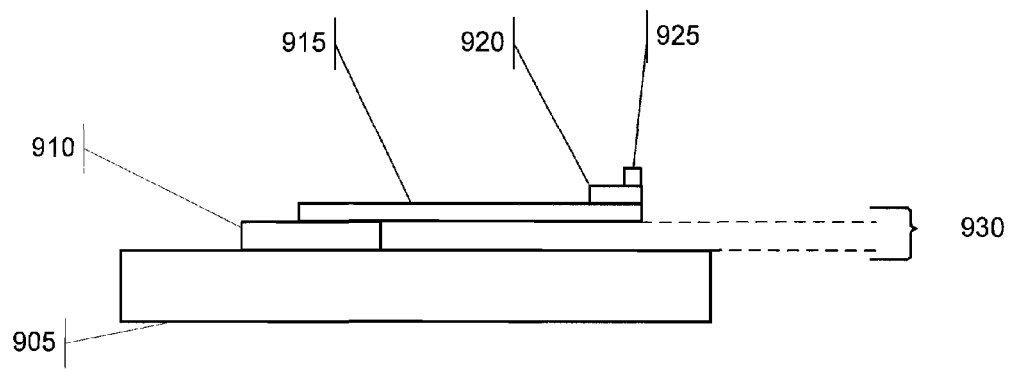
FIGS. 9A-9C is a cross-sectional view of generic probe card, where the bending element is bending (FIG. 9B) and hits the substrate (FIG. 9C).
Figure 9B:
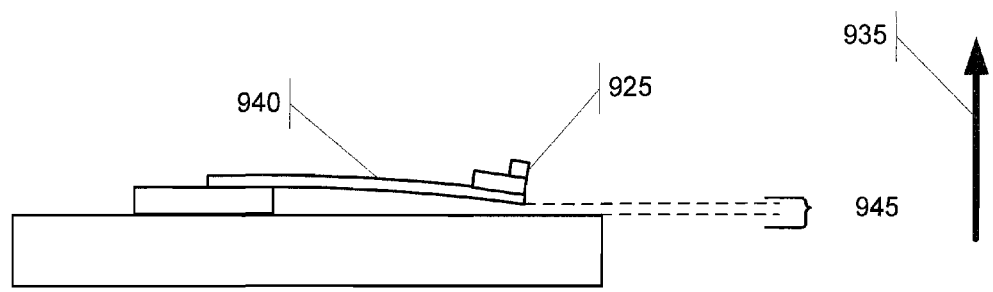
Figure 9C:
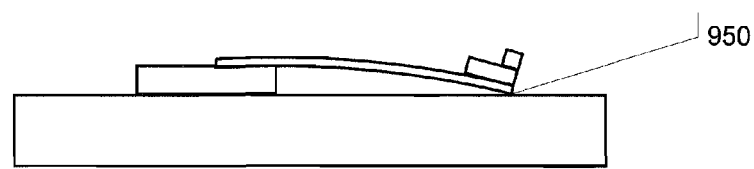

FIG. 6 depicts a probe card (605) with twenty individual die probe areas (610), wherein the probes contain excess overdrive detection structures. An inspection of the probe card (605), and its detection structures, may reveal that several of the probes on the probe card (605) have experienced excess overdrive. For example, the shaded region (615) may contain the only probes that experienced excess overdrive. Because the phenomenon is limited to the region (615) it may indicate that the probe card is not in "tip planarity", meaning that all the probe tips are not contacting the die under test at roughly the same time when the probe card is brought into contact with the die. Non-planarity can affect testing line yield in several ways.

By way of background, as an individual probe travels to make contact with the electrical contact pad of a die (this event is called a touchdown), the probe tip scrubs the contact pad, which perfects an electrical contact with the die such that testing can commence. In fact, the contact pads which are typically aluminum are often coated with a thin layer of aluminum oxide, or other protective coating, and the probe tip must cut through the coating to perfect the electrical connection. Die manufactures prefer that the scrub marks be uniform across the entire wafer because this would indicate that each probe is making approximately the same ohmic electrical connection with the die. Conversely, non-uniform scrub marks could result in certain probe tips not perfecting a good electrical contact (for example, the tip may not even cut through the coating), which could cause false negatives during testing. Non-planarity allows some probes to travel farther along the die contact pad, causing non-uniform scrub marks. Non-planarity can also damage certain probes or the dies themselves by causing excess overdrive. This will also result in faulty testing, potentially reducing production line yield.

While the embodiments above have described the excess overdrive detecting structure on the substrate or on the probe structure, it would be apparent to one of skill in the art that the detection structure may be integrated with or embedded in the substrate and/or structure. Also, gold is described as a material that may be used for the detection structure. It would be apparent, however, that other deformable materials may be used such as, but not limited to, Ag, PbSn solder, and organic polymers.

Having described the methods and structures in detail and by reference to several preferred embodiments thereof, it will be apparent that modifications and variations are possible without departing from the scope of the invention defined in the following claims. Moreover, the applicants expressly do not intend that the following claims "and the embodiments in the specification to be strictly coextensive." Phillips v. AHW Corp., 415 F.3d 1303, 1323 (Fed. Cir. 2005) (en banc).

The invention claimed is:

1. A probe card for testing semiconductor wafers, comprising:
    a substrate;
    a probe structure connected to the substrate; and
    the substrate further comprises an excess overdrive detecting structure made of a permanently deformable material;
    wherein the detecting structure is positioned such that it may come into contact with the probe structure during excess overdrive;
    wherein excess overdrive is indicated by a permanent deformation of the excess overdrive detecting structure.

2. The probe card of claim 1, further comprising:
    a fiducial set for determining alignment of the probe structure, wherein the set contains a first fiducial and a second fiducial;
    the first fiducial comprises the probe structure;
    the second fiducial comprises the excess overdrive detecting structure spaced apart from the first fiducial; and
    wherein alignment is determined by comparing the location of the first fiducial to the location of the second fiducial.

3. The probe card of claim 1, wherein the deformable material is selected from a group consisting of: gold, Ag, PbSn solder, organic polymers and combination thereof.

4. A probe card for testing semiconductor wafers, comprising:
    a substrate;
    a probe structure connected to the substrate; and
    the probe structure further comprises an excess overdrive detecting structure made of a permanently deformable material;
    wherein the detecting structure is positioned such that it may come into contact with the substrate during excess overdrive;
    wherein excess overdrive is indicated by a permanent deformation of the excess overdrive detecting structure.

5. The probe card of claim 4, wherein the deformable material is selected from a group consisting of: gold, Ag, PbSn solder, organic polymers and combination thereof.

6. A method for detecting tip non-planarity of a probe card comprising:
    (a) providing a probe card that comprises a substrate, a plurality of probe structures and a plurality of excess overdrive detection structures;
    (b) inspecting the plurality of excess overdrive detection structures for deformation; and
    (c) determining that the deformation of the plurality of excess overdrive detection structures occurs in a region of the probe card, indicating that the probe card is tip non-planar.

* * * * *